United States Patent
Delamare et al.

(10) Patent No.: US 9,935,255 B2
(45) Date of Patent: Apr. 3, 2018

(54) POWER GENERATOR (71) Applicant: INSTITUT POLYTECHNIQUE DE GRENOBLE, Grenoble (FR)

(72) Inventors: Jérome Delamare, Grenoble (FR); Thibault Ricart, Seyssinet Pariset (FR)

(73) Assignee: Institut Polytechnique de Grenoble, Grenoble (FR)

(*) Notice: Subject to any disclaimer, the term of this patent is extended or adjusted under 35 U.S.C. 154(b) by 177 days.

(21) Appl. No.: 15/031,928

(22) PCT Filed: Oct. 23, 2014

(86) PCT No.: PCT/FR2014/052707
§ 371 (c)(1),
(2) Date: Apr. 25, 2016

(87) PCT Pub. No.: WO2015/059422
PCT Pub. Date: Apr. 30, 2015

(65) Prior Publication Data
US 2016/0276573 A1    Sep. 22, 2016

(30) Foreign Application Priority Data
Oct. 25, 2013 (FR) .................................. 13 60434

(51) Int. Cl.
*H01L 41/00* (2013.01)
*H01L 41/12* (2006.01)
(Continued)

(52) U.S. Cl.
CPC ............ *H01L 41/125* (2013.01); *H01L 41/00* (2013.01); *H01L 41/113* (2013.01); *H02N 2/18* (2013.01); *H02N 2/186* (2013.01)

(58) Field of Classification Search
CPC ....... H01L 41/12; H01L 41/125; H01L 41/20; H01L 41/06; B06B 2201/58
(Continued)

(56) References Cited

U.S. PATENT DOCUMENTS 4,645,961 A    2/1987   Malsky
6,268,682 B1*  7/2001   Audren ............... H01L 41/0993
                                                     310/328

(Continued)

FOREIGN PATENT DOCUMENTS

CN    202443031    9/2012

OTHER PUBLICATIONS

Lafont et al., "Magnetostrictive-piezoelectric composite structures for energy harvesting", J. Micromech. Microeng. vol. 22: 6 pages, 2012.

(Continued)

*Primary Examiner* — Thanh Lam
(74) *Attorney, Agent, or Firm* — Occhiuti & Rohlicek LLP (57) ABSTRACT

A power generator including a converter with an electro-mechnical transducer and a magnetostrictive layer to convert a variation of a magnetic field into a mechanical deformation exerted on the transducer. There is a magnetic field source including a group of several permanent magnets. One of the group or the converter is movable, between first and second positions. The group has several first permanent magnets, one having an aspect ratio of between 1/10 and ten and most of the field lines that loop back do not pass through another first permanent magnet. The first permanent magnets are arranged such that the magnetic field induced inside the magnetostrictive material in the first position by one of the first permanent magnets is parallel to and in the direction (Continued)

opposite to the magnetic field induced at the same instant in the magnetostrictive material by the next first permanent.

12 Claims, 2 Drawing Sheets

(51) Int. Cl.
    *H01L 41/113*     (2006.01)
    *H02N 2/18*     (2006.01)

(58) Field of Classification Search
    USPC .................................................. 310/26, 328
    See application file for complete search history.

(56) References Cited

U.S. PATENT DOCUMENTS

| | | | |
|---|---|---|---|
| 6,984,902 B1 | 1/2006 | Huang et al. | |
| 2005/0104159 A1* | 5/2005 | Lu | F03G 7/002 257/532 |
| 2011/0057629 A1 | 3/2011 | Lin et al. | |
| 2013/0193693 A1* | 8/2013 | Marin | H01L 41/125 290/1 R |
| 2015/0123497 A1* | 5/2015 | Moss | H02K 35/06 310/12.12 |

OTHER PUBLICATIONS

Dai et al., "Energy harvesting from mechanical vibrations using multiple magnetostrictive/piezoelectric composite transducers", Sensors and Actuators A, 166: 94-101, 2011.

\* cited by examiner

POWER GENERATOR

RELATED APPLICATIONS

This application is the national stage, under 35 USC 371, of PCT application PCT/FR2014/052707, filed on Oct. 23, 2014, which claims the benefit of the Oct. 25, 2013 priority date of French Application 1360434, the content of which is herein incorporated by reference.

FIELD OF INVENTION

The invention relates to a power generator.

BACKGROUND

Known power generators comprise:
a converter able to convert a variation of a magnetic field into a difference of potentials between two electric terminals, this converter comprising to that effect:
  an electromechnical transducer able to transform directly a mechanical deformation exerted on this electromechanical transducer into a difference of potentials between the two electric terminals, and
  a magnetostrictive layer extending essentially parallel to a reference plane and fixed without any degree of freedom to the electromechnical transducer, this magnetostrictive layer comprising at least one block of magnetostrictive material able to convert a variation of the magnetic field into a mechanical deformation exerted on the electromechnical transducer,
a magnetic field source including a group of several permanent magnets aligned along an alignment axis, at least one of the group and the converter being movable, alternately, between:
  a first position in which the field lines of the group of permanent magnets provoke a first deformation of the block of magnetostrictive material, and
  a second position in which the block of magnetostrictive material has a second deformation different from the first deformation.

Such generators are described for example in the application US2004126620A1 or in the article A1 below:
T. Lafont, J. Delamare, G. A. Lebedev, D. I. Zakharov, B. Viala, O. Cugat, L. Gimeno, N. Galopin, L. Garbuio and O. Geoffroy, "*Magnetostrictive-piezoelectric composite structures for energy harvesting*", Journal of micromechanics and microengineering, n°22, 2012.

In the known generators, a single uniaxial permanent magnet or a group of permanent magnets is arranged opposite each block of magnetostrictive material. When a group of permanent magnets is used, the south pole of one permanent magnet is directly coupled to the north pole of the permanent magnet of the same group that follows immediately afterwards along the alignment axis. In other words, the magnetic moments of the permanent magnets of this group are all aligned and in the same direction. This group of permanent magnets therefore forms in reality a single uniaxial permanent magnet. The horizontal section of the single permanent magnet, that is to say its section in a plane parallel to the reference plane, is substantially equal to the section of the block of magnetostrictive material. The length L of the single permanent magnet in the direction of its horizontal magnetic moment is therefore generally a few centimeters. Now, for this single permanent magnet to induce a substantial magnetic field inside the block made of magnetostrictive material, its aspect ratio must be close to one. This therefore imposes that the thickness e of the large permanent magnet, in its vertical direction, is approximately equal to its length L. The surface area of the vertical section of the single permanent magnet is therefore close to $L^2$. This results in a significant size of the single permanent magnet and hence of the generator.

Prior art is also known from:
Xinazhi Dai et al.: "Energy harvesting from mechanical vibrations using multiple magnetostrictive/piezoelectric composite transducers", Sensors and actuators A, Elsevier Sequoia S.A, Lausanne CH, vol. 166, N°1, 12/31/2010, pages 94-101;
CN202443031U;
US2011/057629A1;
U.S. Pat. No. 4,645,961A.

SUMMARY OF INVENTION

The invention aims to reduce the size of the generator with constant efficiency or, with constant size, to improve the efficiency of the generator. Efficiency is here defined as being the quantity of electrical energy produced by the generator for a same movement of the group of permanent magnets.

Its object is therefore a power generator according to claim 1.

The utilization of a succession of first permanent magnets as defined above allows several magnetic fields $B_i$ to be induced simultaneously inside the same block of magnetostrictive material in the first position. These fields $B_i$ are typically aligned one after another along an axis of deformation of the block. Each field $B_i$ is in the direction opposite the field $B_{i+1}$ that follows immediately afterwards in the direction of the deformation axis. The block of magnetostrictive material is sensitive only to the inclination of the field $B_i$ relative to its deformation axis and not to the direction of the field $B_i$. The two magnetic fields $B_i$ and $B_{i+1}$ therefore provoke the same mechanical strain on the electromechanical transducer as a single magnetic field $B_g$ induced by a single permanent magnet and corresponding to the vectorial summation of the field $B_i$ and a field $B_{i'+1}$ identical to the field $B_{i+1}$ but in the opposite direction. However, in the first position, in order to induce efficiently the field $B_g$ along a length L parallel to the deformation axis of this block of magnetostrictive material, this single permanent magnet must have a length L and a thickness close to this length L, and hence a vertical section close to or larger than $L^2$. By utilizing the two first permanent magnets to produce a strain close to that obtained with the single permanent magnet, each first permanent magnet has a length L/2 and hence a vertical section close to $L^2/4$. The vertical section of the group of these two first permanent magnets is therefore close to $L^2/2 (=L^2/4+L^2/4)$. Thus, with equal efficiency, a succession of first permanent magnets having an aspect ratio close to one allows the size of the magnetic field source, and hence that of the generator, to be reduced. It is also understood that the greater the number of first permanent magnets, the smaller the size of the group. It is also possible to construct the succession of first permanent magnets such that, with equal size, the efficiency of the generator is improved.

The embodiments of this generator can comprise one or more of the characteristics of the dependent claims.

These embodiments of the generator furthermore have the following advantages:
  the utilization of first permanent magnets whose magnetic moments are parallel to the alignment axis allows, inside the block of magnetostrictive material, a magnetic field to be induced that is greater than in other configurations such as a configuration where the magnetic moments of the first permanent magnets are perpendicular to the alignment axis;

utilizing second magnets whose magnetic moments are perpendicular to the reference plane, or magnetic teeth placed next to the first permanent magnets, allows the intensity of the magnetic field induced inside the block of magnetostrictive material to be increased by more efficiently directing the generated magnetic fields;

utilizing a second permanent magnet whose thickness, in a direction parallel to the alignment axis, is at least two times smaller than the length of the first permanent magnet next to which it is placed, allows the dimensions of the areas inside the block of magnetostrictive material where the induced field is perpendicular to the reference plane to be limited;

configuring the permanent magnets of the group such that the vectorial summation of the magnetic moments of the group equals zero allows the magnetic coupling to be reduced between this group of permanent magnets and an outside magnetic field and the magnetic signature of the converter to be limited;

utilizing a second group of permanent magnets symmetrical to the first group of permanent magnets limits, or even cancels, the forces exerted by the first group of permanent magnets on the block of magnetostrictive material in a direction perpendicular to the reference plane;

utilizing an aspect ratio of between 0.2 and 5 allows the intensity of the magnetic field induced inside the block of magnetostrictive material to be increased;

the presence of another converter or a plate of a soft magnetic material symmetrical to the first converter relative to the group of magnets limits the forces exerted on the group of magnets.

The invention will be better understood on reading the description that will follow, given only as a non-limitative example, and made with reference to the diagrams.

BRIEF DESCRIPTION OF THE DRAWINGS

FIG. 1 is a diagrammatic illustration, partially in vertical section, of a power generator, FIG. 2 is a diagrammatic illustration, in top view, of a converter of the generator of FIG. 1, FIG. 3 is a diagrammatic illustration, in top view, of a magnetostrictive layer utilized in the converter of FIG. 2, FIG. 4 is an illustration, in top view, of one part of a set of permanent magnets utilized in the generator of FIG. 1, FIGS. 5 to 8 and 10 are partial diagrammatic illustrations, in vertical section, of different embodiments of a group of permanent magnets of the set of FIG. 4;

FIG. 9 is a diagrammatic illustration, in top view, of another embodiment of the generator of FIG. 1 in the event of a translational movement;

FIGS. 11 and 12 are diagrammatic illustrations, in vertical section, of two further possible embodiments of the generator of FIG. 1.

In these figures, the same references are used to designate the same elements.

DETAILED DESCRIPTION

In the continuation of this description, characteristics and functions well known to a person skilled in the art are not described in detail.

Figures 1, 2, 3, 4, 5, 6:
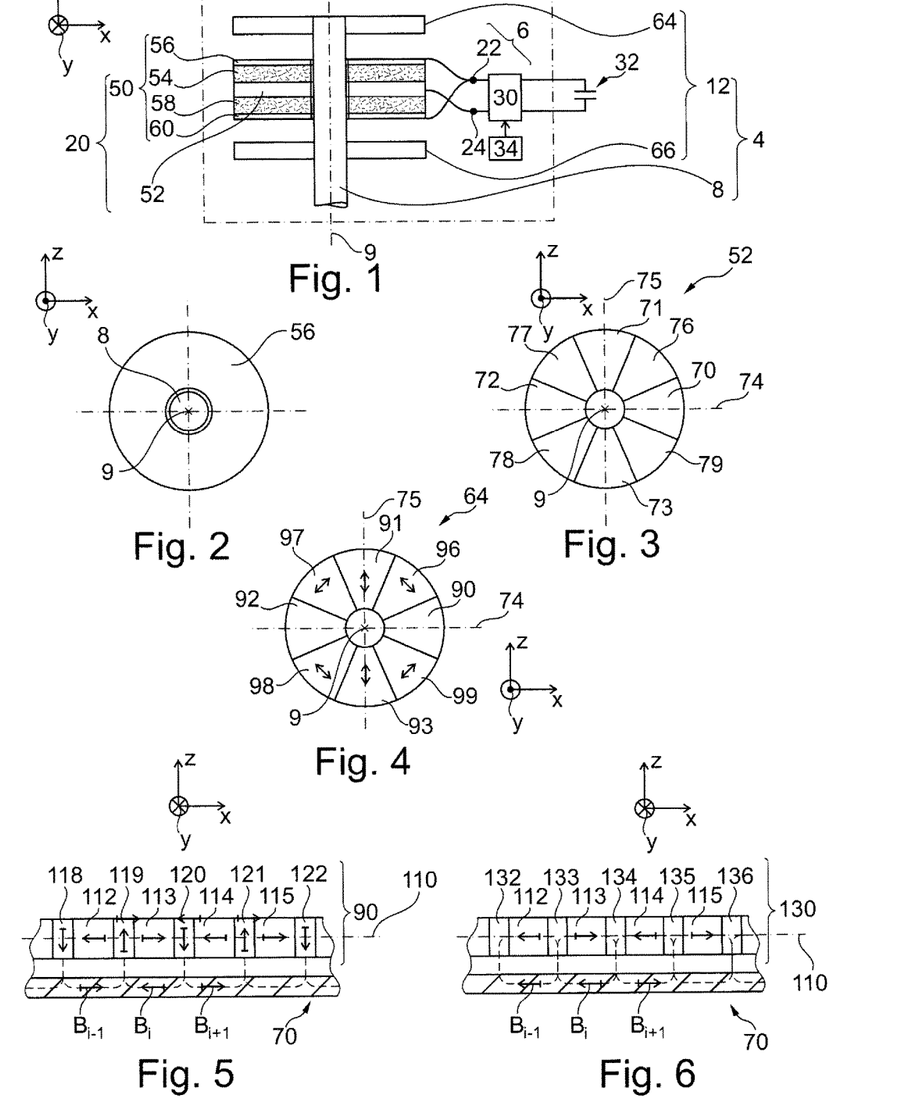

FIG. 1 shows a power generator 2. This generator 2 comprises:

a magnetic field source 4, and an energy harvester 6 suitable for transforming the energy to be harvested into electrical energy.

Here, the magnetic field of the source 4 rotates around a vertical axis Z of an orthogonal coordinate system X, Y, Z. Each of the figures is hereafter oriented relative to this coordinate system X, Y, Z.

In this embodiment, the source 4 comprises a set 12 of permanent magnets fixed without any degree of freedom on a shaft 8 rotationally driven around a vertical axis 9. For example, the shaft 8 is the shaft of a device such as an electricity or gas meter rotationally driven while counting electricity or gas consumption. For the sake of simplicity, only the shaft 8 of this device is shown.

The energy harvester 6 comprises:

a converter 20, which converts the rotating magnetic field into a corresponding excess of electric charges on a connecting terminal 22 or 24 relative to the other of these terminals 22, 24.

a circuit 30 for collecting the excess of electric charges on the terminal 22 or 24 and for transferring these collected electric charges to an electric element 32, and a circuit 34 for controlling the collecting circuit 30.

The element 32 stores, consumes and/or transmits the electric charges collected by the circuit 30. To that effect, the element 32 comprises one or more electric components. Here, the element 32 is a capacitor that stores the harvested electrical energy.

The collecting circuit 30 and the controlling circuit 34 are, for example, identical to those described in the application WO 2007/063194 and, preferably, identical to one of those described in the application filed under the number FR 1260047 on 22 Oct. 2012 by the Commissariat á l'énergie atomique et aux énergies alternatives. These circuits 30 and 34 are consequently not described here in more detail.

The converter 20 is capable of transforming into electricity very slow variations of the energy to be harvested. By "slow variation", what is meant is variations whose fundamental frequency is less than 1 Hz. To that effect, the converter 20 converts a variation of the amplitude of the magnetic field in a given direction into a generation of an excess of charges on the terminal 22 and, alternately, on the terminal 24. This conversion takes place almost instantaneously such that the voltage between the terminals 22 and 24 varies at the same time as and as the amplitude of the magnetic field varies in a given direction.

In this embodiment, the converter 20 is immobile in the coordinate system XYZ. More precisely, it is traversed by the shaft 8, but is not rotationally driven by this shaft. For example, it is mechanically separated from the shaft 8 by a play.

The converter 20 comprises a magnetostrictive layer 52 associated with an electromechanical transducer 50.

The layer 52 extends in a horizontal plane called "reference plane". The reference plane is situated at mid-height of the layer 52. It is made at least in part, of a magnetostrictive material. Here, by "magnetostrictive material", what is meant is a material of which the maximum absolute value of the coefficient of magnetostriction $\lambda_s$ at saturation is higher than 10 ppm (parts per million), and preferably higher than 100 or 1000 ppm. The coefficient $\lambda_s$ is defined by the following relation: $\lambda = \Delta L/L$, where:

ΔL is the elongation rate of the magnetostrictive material in a deformation direction, and L is the length of this material in this direction in the absence of any outside magnetic field.

In this embodiment, the coefficient $\lambda_s$ is positive. For example, the magnetostrictive material is Terfenol-D or FeSiB or a FeCo alloy. The layer 52 is described in more detail with reference to FIG. 3.

The electromechanical transducer 50 includes:
an upper horizontal layer 54 of piezoelectric material,
an upper electrode 56,
a lower horizontal layer 58 of piezoelectric material, and
a lower electrode 60.

The layer 58 and the electrode 60 are symmetrical, respectively, to the layer 54 and the electrode 56 relative to the reference plane. This layer 58 and this electrode 60 are consequently not described in more detail.

The layer 54 extends horizontally over the entire upper face of the layer 52. More precisely, it has an inside face bonded without any degree of freedom to this upper face of the layer 52. This inside face covers the majority, and typically more than 90% or 98%, of the upper face of the layer 52. Here, the layer 54 extends uniformly in each horizontal direction. For example, in this embodiment, the layer 54 has the shape of a horizontal disk with the shaft 8 passing through its center.

The layer 54 also comprises a horizontal outside face situated on the side opposite the inside face.

When functioning, the layer 54 generates an excess of electric charges on the outside face when the layer 52 exerts a mechanical strain on the inside face. This functioning mode is known by the term mode $d_{31}$. In this functioning mode, the capacitance of the transducer 50 is significant, which improves and facilitates the functioning of the converter 20. This functioning mode of the layer 52 is typically obtained with a piezoelectric material vertically polarized in the same direction over all of its inside face.

Here, the piezoelectric material has a coupling coefficient k of more than 5% or 10%. This coupling coefficient is defined in the standard ANSI/IEEE 176-1987 "ANSI/IEEE Standard on Piezoelectricity" or in the standards of the EN 50-324 family. More precisely, here, the piezoelectric material utilized has a piezoelectric coefficient $g_{31}$ higher than $5 \times 10^{-3}$ Vm/N and, preferably, higher than $10 \times 10^{-3}$ Vm/N or $100 \times 10^{-3}$ Vm/N or $200 \times 10^{-3}$ Vm/N at 25° C. Here, the piezoelectric material is LZT (lead zirconate titanate) or LMN-LT (lead magnesium niobate/lead titanate).

The electrode 56 is made of an electrically conductive material. By electrically conductive material, what is meant is a material whose resistivity at 25° C. is lower than $10^{-5}$ Ω.m, and preferably lower than $10^{-6}$ Ω.m or $10^{-7}$ Ω.m. The electrode 56 is deposited directly on the outside face of the layer 54. It typically covers the majority of this outside face and preferably more than 70% or 80% of this outside face. Here, the electrode 56 is embodied by means of a layer in one piece of electrically conductive material that covers the majority of the outside face of the layer 54. More precisely, in this embodiment, the electrode 56 forms a ring surrounding the shaft 8 as is visible in FIG. 2.

The set 12 is fixed without any degree of freedom on the shaft 8 so as to be rotationally driven relative to the converter 20 between a first and a second position. The first position is shown in FIG. 4. The second position is angularly offset by 45° around the axis 9 relative to the first position. The set 12 comprises several groups of uniaxial permanent magnets aligned next to each other along a respective alignment axis. By "uniaxial" what is meant is the fact that each permanent magnet has a single magnetic moment and hence a single south pole and a single north pole. In this embodiment, the groups of permanent magnets are distributed between an upper part 64 and a lower part 66. The lower part 66 is symmetrical to the upper part 64 relative to the reference plane. Only the upper part 64 will therefore be described in detail with reference to FIGS. 4 and 5.

FIG. 3 shows the structure of the layer 52 in more detail. The layer 52 is a disk of the same radius as the layer 54. It comprises four blocks 70 to 73 of magnetostrictive material extending along two horizontal axes 74, 75 intersecting on the axis 9. Here, these axes 74, 75 extend, respectively, parallel to the directions X and Y. Each block 70 to 73 is formed in a single piece, that is to say, of a single block of material.

Here, the blocks 70 to 73 are made of the same magnetostrictive material. Moreover, each block 70 to 73 has its own preferential deformation axis. The preferential deformation axis of a block is the axis along which the amplitude of its deformation is maximal when field lines parallel to this axis pass through the block.

For some magnetostrictive materials, when the field lines magnetically saturate the magnetostrictive block, the preferential deformation axis is parallel to these field lines. In this situation, the preferential deformation axis is imposed by the arrangement of the magnetostrictive block relative to the source of these field lines. When the block of magnetostrictive material is not magnetically saturated, the preferential deformation axis can also be an intrinsic property of the block, which is due, for example, to the crystalline orientation of the magnetostrictive material and/or to the aspect ratio of the block. Here, by "aspect ratio of the block", what is meant is the ratio of the width to the length of the horizontal rectangle of smaller surface area inside which this block is contained. The aspect ratio of each block is typically strictly less than 1 or 0.5 or 0.2 and the preferential deformation axis is here parallel to its length. In the embodiments described below, unless indicated otherwise, the preferential deformation axis of each block is therefore systematically coincident with its longitudinal axis. Here, the preferential deformation axes of the blocks 70 and 72 are aligned on the axis 74 and the preferential deformation axes of the blocks 71, 73 are aligned on the axis 75.

The block 70 has the shape of an angular sector whose vertex is situated on the axis 9, and whose bisector is coincident with the axis 74. The angle at the vertex of the block 70 equals 45°. In this embodiment, given that the shaft 8 passes through the layer 52, the vertex of the angular sector is cut to leave a passage for the shaft 8. The blocks 71 to 73 are identical to the block 70 except that they are angularly offset around the axis 9 relative to the block 70 by, respectively, 90°, 180° and 270°.

In this embodiment, the layer 52 further comprises four regions 76 to 79 lacking any magnetostrictive material and inserted between the blocks 70 to 73. The lateral edges of the blocks 70 to 73 are therefore mechanically separated from the lateral edges of the other immediately adjacent blocks by these four regions 76 to 79.

The region 76 is delimited on one side by a lateral edge of the block 70 and on the other side by a lateral edge of the block 71. Its outer periphery is aligned with a vertical edge of the layers 54 and 58. The regions 77, 78 and 79 are identical to the region 76 except that they are angularly offset around the axis 9 by, respectively, 90°, 180° and 270°. In this embodiment, the regions 76 to 79 are therefore angular sectors having the same shape as the block 70, but angularly offset around the axis 9 by, respectively, 45°, 135°, 225° and 315° relative to the position of the angular sector of the block 70. The thickness of each of these regions 76 to 79 is equal to the thickness of the blocks 70 to 73.

FIG. 4 shows in more detail the upper part 64 of the set 12 in the first position. In FIG. 4, the direction of the alignment axis of each group of permanent magnets is shown by a double arrow.

In this embodiment, the part 64 comprises four groups 90 to 93 of permanent magnets. The angle between the alignment axes of the groups 90 to 93 is chosen equal to the angle existing between the preferential deformation axes of the blocks 70 to 73 plus or minus 10°, and preferably, plus or minus 5°. In the first position, the alignment axes of the permanent magnets of the groups 90 and 92 are therefore parallel to the axis 74 plus or minus 10° or 5°. At the same instant, the alignment axes of the permanent magnets of the groups 91 and 93 are parallel to the axis 75, plus or minus 10° or 5°.

The groups 90 to 93 each have the same shape, in a horizontal plane, as the blocks 70 to 73 and are arranged relative to one another as described for the blocks 70 to 73. In the first position, each block 70 to 73 is therefore opposite a respective group 90 to 93.

Hereafter, a block is said to be opposite a group of magnets if the surface area of the intersection between the orthogonal projections of this block and of this group, on the reference plane, is larger than or equal to more than 50%, and preferably more than 80% or 90%, of the surface area of this block in this plane. In these conditions, this block is also said to be situated inside the orthogonal projection of the group of magnets. This same definition is also utilized to define what is meant by the fact that an element is situated opposite a group of magnets. In the first position, the blocks 70 to 73 are contained inside the orthogonal projections, respectively, of the groups 90 to 93.

In the first position, the regions 76 to 79 are situated outside the orthogonal projections of the groups 90 to 93. An element is considered to be situated outside the orthogonal projection of a group of magnets if it is not situated inside this projection with the definition given above. When an element is outside the orthogonal projection of a group of magnets, it is also said to be in an offset position relative to this group of magnets.

Here, in the first position, the groups 90 and 92 are symmetrical to each other relative to a vertical plane passing through the axis 75. Similarly, at the same instant, the groups 91 and 93 are symmetrical to each other relative to a vertical plane passing through the axis 74. Only the group 90 will therefore be described in more detail with reference to FIG. 5.

Opposite the regions 76 to 79, in the first position, the part 64 comprises the supplementary groups 96 to 99 of permanent magnets. Each of these groups 96 to 99 has the same shape as the group 90, except that these groups 96 to 99 are angularly offset around the axis 9 by, respectively, 45°, 135°, 225° and 315° relative to the position of the group 90. After a rotation of 45° of the set 12 in order to reach the second position, each block 70 to 73 is therefore situated opposite a respective group 96 to 99.

The directions of the alignment axes of the groups 96 to 99 are such that the magnetic field lines they generate inside the blocks 70 to 73 in the second position are turned by 90° in a horizontal plane, relative to the magnetic field lines generated by the groups 90 to 93 inside these same blocks but in the first position. For this, the alignment axis of each group 96 to 99 is perpendicular to the bisector of the angular sector occupied by this group. The detailed embodiment of these groups 96 to 99 is deduced from what will be described for the group 90.

FIG. 5 shows the group 90 in more detail. In FIG. 5 and the following figures, the magnetic moment of each permanent magnet is shown by an arrow.

FIG. 5 shows a portion of the group 90. In order to simplify this figure and the following figures, only the block 70 opposite the group 90, in the first position, has been shown. In the same way, the field lines generated by the group of permanent magnets are shown in this figure and the following figures by dotted lines.

The permanent magnets of the group 90 are aligned next to each other along a horizontal alignment axis 110. In the first position, this axis 110 is parallel to the axis 74 and to the direction X. The axis 110 intersects the axis 9.

Here, each permanent magnet of the group 90 is formed from a single block of magnetized materials. Each permanent magnet is uniaxial and therefore has a single magnetic moment in a single direction. Each permanent magnet therefore has a single pair of south and north poles.

The group 90 comprises a succession, along the axis 110, of first permanent magnets whose aspect ratio is close to one. By "aspect ratio close to one", what is meant is an aspect ratio higher than 1/10 and, preferably, higher than 1/7 or 1/5 or 1/3 or 1/2 and lower than 10, than 7, than 5 or than 3 or than 2. Here, the aspect ratio of the first permanent magnets equals one. By aspect ratio of a permanent magnet, what is meant is the ratio e/l, where:

l is the length of the permanent magnet in the direction of its magnetic moment,1 and, e is the thickness of the permanent magnet in a direction perpendicular to that of its magnetic moment.

If the permanent magnet does not have a rectangular or square vertical section, the dimensions l and e defined above are then those of the rectangle of smaller surface area containing the vertical section of this permanent magnet.

It is also recalled that the thickness is the smallest dimension of those dimensions perpendicular to the direction of the magnetic moment.

Here, by convention, "first permanent magnet" refers to a permanent magnet of the group 90, which has the two following characteristics:

its aspect ratio is close to one, and most of the field lines that loop back by means of the block 70 and of this first magnet do not pass through another first permanent magnet of the group 90 or of another group of magnets.

The group 90 includes at least two first permanent magnets and, preferably, at least four or ten first permanent magnets. Only four first permanent magnets 112 to 115 are shown in FIG. 5.

The magnetic moments of these first permanent magnets are aligned on the axis 110. Moreover, the magnetic moment of any one of these first permanent magnets is in the direction opposite that of the first permanent magnet that immediately follows or precedes it in the direction X. The poles of same polarity of two successive first permanent magnets are therefore opposite one another. Here, the magnetic moments of the magnets 112 and 114 are directed to the left while the magnetic moments of the magnets 113 and 115 are directed to the right.

In this embodiment, in addition to the first permanent magnets, the group 90 further comprises second permanent magnets designed to direct the magnetic flux from the group 90 to the block 70. Five second permanent magnets 118 to 122 are shown in FIG. 5. Each second permanent magnet is placed between the poles of two consecutive first permanent magnets in the direction X. The second permanent magnet is therefore not separated by another first permanent magnet from the first permanent magnet next to which it is immediately placed. Here, each second permanent magnet is directly coupled on the left and on the right, along the direction X, to a respective pole of a first permanent magnet. The magnetic moments of the second permanent magnets are perpendicular to the reference plane and arranged so as to direct the magnetic flux from the first permanent magnets to the block 70. To that effect, the magnetic moment of the second permanent magnets coupled on each side to south poles of two consecutive first permanent magnets is directed to the block 70. This is the case in FIG. 5 of the second permanent magnets 118, 120 and 122. Conversely, the magnetic moment of the second permanent magnets coupled on each side to north poles of two immediately consecutive first permanent magnets is directed upwards, that is to say, away from the block 70. This is the case in FIG. 5 of the second permanent magnets 119 and 121.

The second permanent magnets do not necessarily have an aspect ratio close to one. Here, the length I of the second permanent magnets in the direction Z is equal to the thickness e of the first permanent magnets. The thickness of the second permanent magnets in the direction X is two or three times smaller than the length of the first permanent magnets. The dimension of the second permanent magnets in the direction Y lies between the dimension in this same direction of the first permanent magnet immediately preceding, and of the first permanent magnet immediately following, in the direction X.

Because of this arrangement of the first permanent magnets and their aspect ratio close to one, the succession of first permanent magnets produces, at the same instant, inside the block 70, a succession of magnetic fields $B_i$ all parallel to the axis 110 and whose directions alternate. The intensities of the magnetic fields induced in this way inside the block 70 are much higher than if a single uniaxial permanent magnet of the same dimension as the group 90 was utilized. It is recalled here that magnetostrictive materials are not sensitive to the direction of the magnetic field, but only to the direction of the magnetic field induced relative to their preferential axes of deformation. The embodiment described here exploits this property to produce, with an identical size, a tensile stress exerted by the block 70 on the piezoelectric layers 54 and 58 greater than if a single uniaxial permanent magnet was utilized. This therefore increases the efficiency of the generator with identical size, or, with equal efficiency, allows the size of the set 12 to be reduced.

The magnetic moments of the first permanent magnets are equal in amplitude but in opposite directions two by two. The first permanent magnets whose magnetic moments are opposite are arranged immediately one after the other along the axis 110. Consequently, the vectorial summation of the magnetic moments of the permanent magnets of the group is zero or almost zero. By "almost zero" what is meant here is that this vectorial summation gives a vector whose amplitude equals zero plus or minus $\in$, where $\in$ is equal to 10%, and preferably 5%, of the sum of the amplitudes of the magnetic moments of this group of magnets. This limits the magnetic coupling between the block 90 and a uniform external magnetic field.

The functioning of the generator 2 is as follows. In the first position, shown in FIG. 4, the blocks 70 to 73 are traversed by field lines parallel to their respective preferential deformation axis. In response, the deformation, here elongation, of the blocks 70 to 73 is maximal. The layer 52 therefore exerts, in this first position, maximal tensile stresses on the layers 54 and 58 at the same time, along the axes 74 and 75. In the areas of the outside face of the layers 54 and 58 situated in vertical alignment with the blocks 70 to 73, an excess of same sign electric charges is therefore produced. Moreover, given that the layers 54 and 58 are rigid, the areas of the layers 54 and 58 situated in vertical alignment with the regions 76 to 79 are also subjected to a tensile stress such that the outside face of these layers 54 and 58 also have areas, opposite the regions 76 to 79, generating an excess of same sign electric charges. Henceforth, in this first position, same sign electric charges are generated over virtually the totality of the outside face of the layers 54 and 58, which increases the differences of potentials produced by the converter 20.

When the converter 20 makes ⅛ of a turn around the axis 9 from the first position, the second position is reached. In this second position, the blocks 70 to 73 are situated halfway between the groups 90 to 93 consecutively and opposite a respective group 96 to 99. The regions 76 to 79 are opposite the groups 90 to 93. Since these regions 76 to 79 are lacking any magnetostrictive material, the blocks 70 to 73 no longer tend to elongate, but, on the contrary, they shrink simultaneously. In fact, the magnetic field lines that pass through the blocks 70 to 73 are now perpendicular to the longitudinal axes of these blocks. Henceforth, each block 70 to 73 exerts a compression stress on the layers 54 and 58. This allows the amplitude between the differences of potentials produced in the first and second positions to be increased.

The figures that follow show different possible variants of the group 90. The functioning of the generator 2 with these variants is deduced from the explanations previously given with the group 90.

FIG. 6 shows a group 130 of permanent magnets. This group 130 is identical to the group 90 except that the second permanent magnets are replaced by magnetic teeth of the same dimensions. Each magnetic tooth is made of a soft magnetic material. By soft magnetic material, what is meant is a magnetic material whose coercive magnetic field is less than 100 $A.m^{-1}$. For example, it is a ferromagnetic material. More precisely, in FIG. 6, the second permanent magnets 118 to 122 are replaced by magnetic teeth 132 to 135 of the same dimensions as these second magnets.

Figure 7:
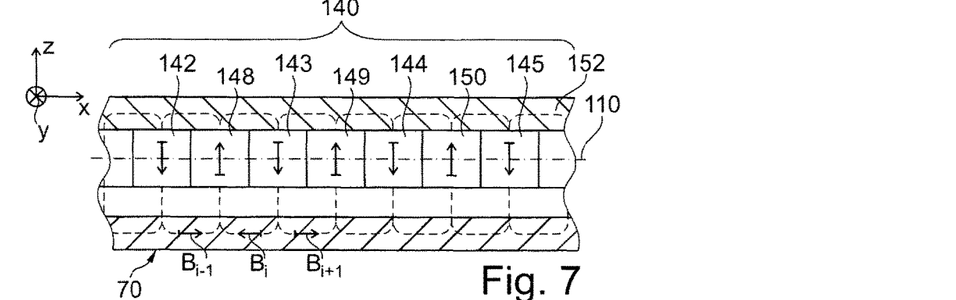

FIG. 7 shows a group 140 of permanent magnets. In this embodiment, the first permanent magnets are identical to the first permanent magnets of the group 90 except that they are turned such that their magnetic moments are perpendicular to the reference plane. Moreover, the magnetic moments of the first permanent magnets are in the same direction. Here, by convention, the magnetic moments of the first permanent magnets are considered to be directed to the block 70. Four first permanent magnets 142 to 147 are shown in FIG. 7.

The group 140 further comprises second permanent magnets for reinforcing and directing the magnetic flux from the group to the block 70. These second permanent magnets are positioned like the second permanent magnets of the group 90. However, the magnetic moments of these second permanent magnets are directed vertically upwards, that is to say away from the block 70. Three second permanent magnets 148 to 150 are shown in FIG. 7.

In this embodiment, the second permanent magnets also have an aspect ratio close to one. Here, their aspect ratio is identical to that of the first permanent magnets. In order therefore to describe this embodiment, another convention could have been adopted, consisting of considering that the first permanent magnets each have a magnetic moment directed upwards. With this other convention, the permanent magnets described previously as second permanent magnets are first permanent magnets and vice versa.

Preferably, on the side opposite the block 70, a magnetic plate 152 is fixed without any degree of freedom to the south and north poles of the permanent magnets of the group 140. The plate 152 is made of a soft magnetic material. It allows the intensity of the magnetic field induced by the group 140 to be increased inside the block 70 and limits the magnetic field leakages from the side opposite the block 70.

Figure 8:
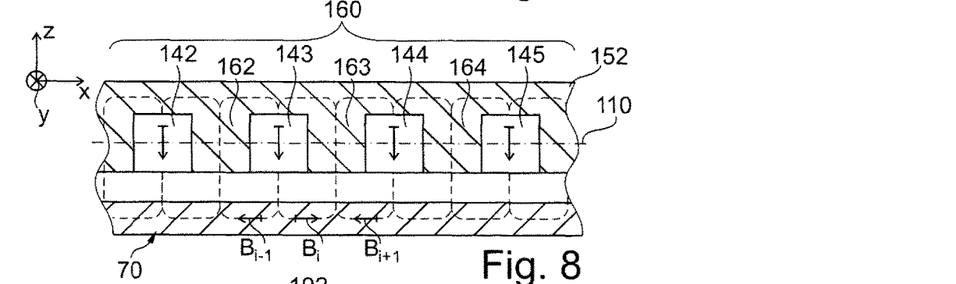

FIG. 8 shows a group 160 of permanent magnets. This group 160 is identical to the group 140 except that the second permanent magnets are replaced by magnetic teeth of the same dimensions as the replaced second permanent magnets. Here, three magnetic teeth 162 to 164 are visible in FIG. 8. The magnetic teeth preferably form just a single block of material with the plate 152. The combination of the magnetic teeth and the plate 152 therefore forms a magnetic yoke.

The embodiments described until now were described for the particular case where the set of permanent magnets turns relative to the converter. However, everything that has been described in this particular context also applies to the case where the set of permanent magnets moves translationally relative to the converter parallel to the reference plane. In order to pass from one embodiment to the other, it suffices to "unwind" the structures described in the case of a rotational movement to obtain the corresponding embodiment in the case of a translational movement.

Figures 9, 10, 11, 12:
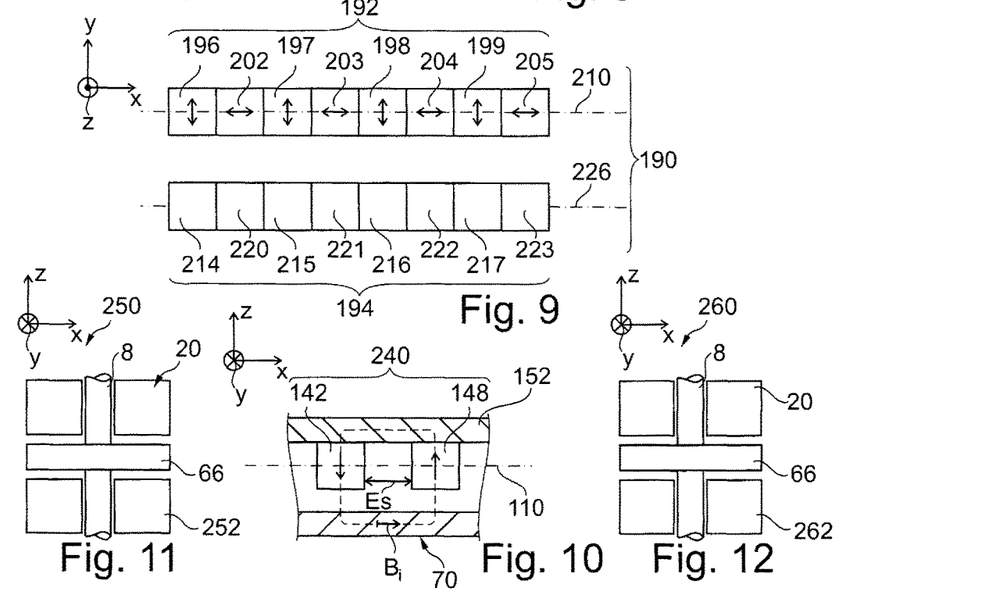

For example, FIG. 9 shows a generator 190 corresponding to the embodiment of FIG. 1, but with a translational movement. In order to simplify FIG. 9, only the principal elements that differ relative to the generator 2 are shown. More precisely, in the generator 190, the set 12 is replaced by a set 192 of permanent magnets and the layer 52 is replaced by a layer 194. The layer 194 is interposed between two flat layers of piezoelectric materials similar to the layers 54 and 58. In FIG. 9, the set 192 and the layer 194 are shown in top view and next to each other. In reality, the set 192 and the layer 194 are vertically superposed one above the other.

The set 192 includes eight groups 196 to 199 and 202 to 205 of permanent magnets. All of these groups of permanent magnets are aligned on a same axis 210 parallel to the direction X. The groups 202 to 204 are interposed between, respectively, the groups 196, 197, the groups 197, 198 and the groups 198, 199. The group 205 is coupled, on the right, to the group 199. The alignment axes of the groups 196 to 199 are parallel to the direction Y. The alignment axes of the groups 202 to 205 are parallel to the direction X. These groups of permanent magnets are embodied as described previously. All of these groups have the same width in the direction X.

The layer 194 comprises four blocks 214 to 217 of the same magnetostrictive material, separated by four regions 220 to 223 lacking any magnetostrictive material. These blocks and regions are all aligned on an axis 226 parallel to the direction X. More precisely, the regions 220 to 222 are interposed between, respectively, the blocks 214, 215, the blocks 215, 216 and the blocks 216, 217. The region 223 is coupled to the right of the block 217. This region 223 can also be omitted. The preferential deformation axes of the blocks 214 to 217 are parallel to the direction Y.

The set 192 and the layer 194 can be moved relative to one another between a first position, shown in FIG. 9, and a second position. In the second position, the layer 194 is offset by one step to the left, in the direction X, relative to the first position. This step is equal here to the width of a group of magnets of the set 192.

In the first position, the blocks 214 to 217 are situated opposite the groups 196 to 199 and the regions 220 to 223 are situated opposite the groups 202 to 205. In the second position, it is the regions 220 to 223 that are situated opposite the groups 196 to 199 and the blocks 215 to 217 that are situated opposite the groups 202 to 205. In this example, in the second position, the block 214 is not opposite any element. In the second position, each group 196 to 198 is situated halfway between two respective blocks of the blocks 214 to 217.

In the arrangement described, the groups 196 to 199 correspond functionally to the groups 90 to 93 and the groups 202 to 205 correspond functionally to the groups 96 to 99. Likewise, the blocks 214 to 217 correspond functionally to the blocks 70 to 73 and the regions 220 to 223 correspond functionally to the regions 76 to 79. The functioning of the generator 190 is therefore deduced from the functioning of the generator 2, except that here the generation of electricity is provoked by a translational movement along the direction X of the layer 194 relative to the set 192 and not by a rotational movement.

FIG. 10 shows a group 240 of permanent magnets capable of being utilized in place of the group 90. This group 240 is identical to the group 140 except that the second permanent magnets are laterally spaced from the first permanent magnets by a distance $E_s$ measured along the axis 110. For example, the distance $E_s$ is longer than or equal to e/2 or longer than or equal to e, where e is the thickness of the first permanent magnets.

With the group 240, the horizontal part of the field lines induced inside the block 70 by a single first permanent magnet is longer than in the embodiment of FIG. 7.

FIG. 11 shows a generator 250 identical to the generator 2, except that:
  the part 64 of the set 12 of magnets is omitted, and
  a converter 252, symmetrical to the converter 20 relative to a horizontal plane, is added.

The plane of symmetry is a median plane of the part 66. In order to simplify FIG. 11, only the characteristics of the generator 250 that differ from those of the generator 2 have been shown. This embodiment allows the magnetic field present on both sides of the part 64 to be exploited to generate electricity. Moreover, this embodiment allows the forces exerted on the part 66 to be made symmetrical. This reduces the forces exerted on the part 66.

FIG. 12 shows a generator 260 identical to the generator 250 except that the converter 252 is replaced by a disk 262 of soft magnetic material. The disk 262 also allows the forces exerted on the part 66 to be limited.

Numerous other embodiments are possible. For example, the electrode 56 does not need to be formed from a singe block of material. As a variant, the electrode 56 includes several conductive pads distributed over the outside face of the layer 54 and mechanically separated one from the other by channels filled with an electrically insulating material, electric conductors connecting these different pads in series.

In another variant, lower electrodes of electrically conductive material are interposed between the layer 52 and, on one side, the layer 54 and on the other side, the layer 60 of piezoelectric material.

The piezoelectric layer is also not necessarily of a single block. For example, it can also be embodied by coupling several blocks of piezoelectric material next to each other. In this case, all the blocks of piezoelectric material are polarized or not in the same direction.

The piezoelectric layer and the electrodes can also be embodied as described in the following article:

T. Lafont, J. Delamare, G. A. Lebedev, D. I. Zakharov, B. Viala, O. Cugat, L. Gimeno, N. Galopin, L. Garbuio and O. Geoffroy, "*Magnetostrictive-piezoelectric composite structures for energy harvesting*", Journal of micromechanics and microengineering, n°22, 2012.

In this case, the piezoelectric layer functions in mode $d_{33}$.

Other piezoelectric materials than LZT can be used. For example, the piezoelectric material can be PVDF (polyvinylidene fluoride) or a piezoelectric foam such as one of those described in the following article:

Imran Patel, "*Ceramic based intelligent piezoelectric energy harvesting device*", Intechopen, 6 Sep. 2011.

The order of stacking, in the vertical direction, of the magnetostrictive and piezoelectric layers can be different. For example, the converter can comprise, successively, in the vertical direction, a magnetostrictive layer, then a piezoelectric layer, then a magnetostrictive layer.

The layer of piezoelectric material and the magnetostrictive layer can have different shapes. For example, advantageously, they can also be formed in elliptical rather than disk shapes. The horizontal section of these layers can also, as a variant, be square or rectangular or be a polygon with more than 5 vertices.

Electromechanical transducers other than a layer of piezoelectric material can be utilized. The electromechanical transducer of the converter 20 does not therefore necessarily comprise a piezoelectric material. For example, as a variant, the electromechanical transducer is embodied from a capacitor whose capacitance varies according to a mechanical movement. The capacitor typically comprises two mobile electrodes separated one from the other by a dielectric material. When the electrodes move, the capacitance of the capacitor varies. The movement of the electrodes is activated by a magnetostrictive material in order to convert a variation of the magnetic field into a variation of electric charges.

In a particular embodiment, the electrodes of the capacitor are made of a magnetostrictive material. In this case, a variation of the amplitude of the magnetic field in a given direction causes a variation of the surface area of the electrodes and hence of the capacitance of this capacitor.

In another variant, standard electrodes and a dielectric whose permittivity varies according to the magnetic field are chosen for the capacitor. It can be, for example, $BiFeO_3$. Also in this case, a variation of the magnetic field causes a variation of the capacitance of the capacitor.

The variation of the capacitance of the capacitor is then transformed into a generation of electric charges by an electronic device, such as, for example, a device implementing electrets. The generation of electricity based on a variation of capacitance and by means of electrets is described, for example, in the following article:

S. Boisseau, G. Despesse and A. Sylvestre, "*Optimization of an electret-based energy harvester*", Smart Material and Structures, 2010, 19 075015, IOP Publishing Ltd.

Numerous other embodiments of the magnetostrictive layer are possible. For example, the shape of the blocks 70 to 73 of magnetostrictive material can be modified. These blocks can therefore be rectangular such that the meeting of the blocks 70 to 73 forms a cross. In this case, a corresponding modification must be made to the horizontal section of the groups of permanent magnets opposite in the first position.

As a variant, the regions 76 to 79 comprise blocks of magnetostrictive material whose coefficient of magnetostriction is of the opposite sign to the coefficient of magnetostriction of the blocks 70 to 73. In another variant, the blocks 76 to 79 each comprise a block of magnetostrictive material whose coefficient of magnetostriction is of the same sign as that of the blocks 70 to 73, but whose preferential deformation axis is parallel to the alignment axis of a group 96 to 99 of permanent magnets in the first position.

The number of blocks of magnetostrictive material and the number of groups of magnets can be more than four, eight or twelve. In particular, if the movement of the set is linear, the number of groups of permanent magnets can be very high. Preferably, if the movement between the first and second positions takes place by rotation, then the number of blocks and groups of magnets is less than twelve. However, if the number of blocks of the magnetostrictive layer is more than twelve, for example, it is then possible to provide, in each region separating the different blocks of the magnetostrictive layer, a mechanism limiting or eliminating the magnetic couplings that are capable of existing between the different blocks thereof. The number of blocks of magnetostrictive material can also be less than four. For example, in the simplest case, the layer 52 comprises a single block of magnetostrictive material and, for example, a single group of magnets.

The different blocks of the magnetostrictive layer do not necessarily extend in the same plane. In this case, the reference plane is the median plane of the different planes in which the different blocks extend.

If a magnetostrictive material with a negative coefficient of magnetostriction is used instead of a magnetostrictive material with a positive coefficient of magnetostriction, in the first position, the sign of the mechanical strains exerted by the blocks is reversed relative to what was described in the case of a magnetostrictive material with a positive coefficient of magnetostriction. If the coefficient of magnetostriction is negative, the magnetostrictive material can be Samfenol, which is an alloy of samarium, or a cobalt alloy.

The magnetostrictive material used to embody the blocks can also be an isotropic magnetostrictive material, that is to say, a material that does not intrinsically have a preferential deformation axis.

As a variant, the regions between the blocks of magnetostrictive material each comprise a supplementary block of magnetostrictive material whose coefficient of magnetostriction is of the opposite sign to that of the blocks 70 to 73 and whose preferential deformation axis extends radially. In the second position, the preferential axes of deformation of the supplementary blocks are therefore aligned with the alignment axis of the groups 90 to 93. Henceforth, in the second position, the supplementary blocks shrink, and this exerts compression stresses in the areas of the layers 54 and 58 situated in vertical alignment with these supplementary blocks. In this second position, almost the entirety of the inside surface of the layers 54 and 58 is therefore subjected to a compression stress. This allows the amplitude between the differences of potentials produced in the first and second positions to be increased relative to the embodiment of FIG. 1 and hence the efficiency of the converter to be increased.

The regions between the blocks can be omitted. In this case, the lateral edges of a block are immediately contiguous with the lateral edges of blocks which are immediately adjacent but whose preferential deformation axes are oriented differently.

Numerous variants of the set of permanent magnets are also possible. For example, the groups 96 to 99 can be omitted. Likewise, the part 66 of the set of magnets can also be omitted.

In another embodiment, the second permanent magnets are not directly coupled to the first permanent magnets but are magnetically connected to these first permanent magnets by means of magnetic cores made of soft magnetic material.

It is also possible to eliminate the second permanent magnets and/or the magnetic teeth.

Each permanent magnet is made of a single block of material. As a variant, all of the permanent magnets of a group are made of a same block of material comprising areas simultaneously magnetized in different directions in order to form the first, and possibly second permanent magnets.

The permanent magnets of the set 12 can be arranged in a plane that is not necessarily parallel to the reference plane. In another variant, the alignment axes of the different groups of the set are not all coplanar.

The directions of the alignment axes can be modified. For example, in the embodiment of FIG. 9, the directions of the alignment axes of all the groups 196 to 199 and 202 to 205 are turned 45° to the right. An angular offset of 90° is therefore preserved between the alignment axes of two immediately consecutive groups of magnets. The preferential deformation axis of the blocks 214 to 217 is then also turned by 45°. The functioning of this variant remains the same as that described with reference to FIG. 9. The directions of the alignment axes of the groups in the other embodiments can likewise be modified.

The different embodiments of a group of magnets previously described can be combined either within a same set or even within a same group.

The relative movement of the set 12 relative to the converter 20 can also be obtained by fixing the set 12 without any degree of freedom and by fixing the converter 20 to the shaft 8. Other movements of the converter 20 relative to the set 12 are possible. For example, the converter 20 is rotationally mounted around a horizontal axis such that it is situated opposite the set 12 in a given angular position and otherwise offset relative to the set 12.

The invention claimed is:

1. A power generator comprising:
a converter able to convert a variation of a magnetic field into a difference of potentials between two electric terminals, the converter comprising to that effect:
an electromechnical transducer able to transform directly a mechanical deformation exerted on this electromechanical transducer into a difference of potentials between the two electric terminals, and
a magnetostrictive layer extending essentially parallel to a reference plane and fixed without any degree of freedom to the electromechnical transducer, the magnetostrictive layer comprising at least one block of magnetostrictive material able to convert a variation of the magnetic field into a mechanical deformation exerted on the electromechanical transducer,
a magnetic field source including a group of several permanent magnets aligned along an alignment axis, at least one of the group and the converter being movable, alternately, between:
a first position in which the field lines of the group of permanent magnets pass through the same block of magnetostrictive material and provoke a first deformation of this block of magnetostrictive material, and
a second position in which the block of magnetostrictive material has a second deformation different from the first deformation,
wherein the group of permanent magnets comprises a succession of first permanent magnets along the alignment axis, one first permanent magnet being a permanent magnet of the group, the first permanent magnet having the two following characteristics:
an aspect ratio, defined by the ratio of its thickness to its length in the direction of its magnetic moment, of between 1/10 and ten, and
most of the field lines that loop back by means of the block of magnetostrictive material and of the first permanent magnet in the first position do not pass through another first permanent magnet,
the first permanent magnets being arranged relative to one another such that the magnetic field induced inside the block of magnetostrictive material in the first position by any one of the first permanent magnets is parallel to and in the direction opposite to the magnetic field induced at the same instant in the same block by the first permanent magnet that follows immediately afterwards along the alignment axis.

2. The generator as claimed in claim 1, wherein each first permanent magnet has a magnetic moment parallel to the alignment axis and in the opposite direction to the direction of the magnetic moment of the first permanent magnet that follows immediately afterwards in said succession of first permanent magnets.

3. The generator as claimed in claim 2, wherein the group further comprises at least one second permanent magnet placed immediately next to one of the first permanent magnets, the magnetic moment of this second permanent magnet being perpendicular to the reference plane and its direction being the same as that of the field lines that pass through the block of magnetostrictive material and the first permanent magnet next to which it is immediately placed.

4. The generator as claimed in claim 3, wherein the length of the second permanent magnet in the direction of its magnetic moment is longer than or equal to the thickness, in the direction perpendicular to the reference plane, of the first permanent magnet next to which it is immediately placed, and the thickness of the second permanent magnet in a direction parallel to the alignment axis is at least two times smaller than the length of the first permanent magnet next to which it is immediately placed.

5. The generator as claimed in claim 2, wherein the magnetic field source comprises at least one magnetic tooth, made of soft magnetic material, directly placed next to one of the first permanent magnets in the direction of the alignment axis.

6. The generator as claimed in claim 1, wherein the amplitude of the vectorial summation of the magnetic moments of the group of permanent magnets equals zero plus or minus $\in$ where $\in$ equals 10% of the sum of the amplitudes of the magnetic moments of the permanent magnets of the group.

7. The generator as claimed in claim 1, wherein the magnetic field source comprises a second group of permanent magnets, symmetrical to the first group of permanent magnets relative to a plane parallel to the reference plane and passing at mid-height of the block of magnetostrictive material.

8. The generator as claimed in claim 1, wherein the converter is situated on one side of the group of permanent magnets and the generator comprises another converter placed on the opposite side relative to the group of permanent magnets, the two converters being symmetrical to one another relative to a median plane of the group of permanent magnets containing the alignment axis of this group.

9. The generator as claimed in claim 1, wherein the converter is situated on one side of the group of permanent magnets and the generator comprises a plate of magnetically soft material placed on the opposite side relative to the group of permanent magnets.

10. The generator as claimed in claim 1, wherein the aspect ratio of the first permanent magnets is more than or equal to 0.2 and less than or equal to 5.

11. The generator as claimed in claim 1, wherein the aspect ratio of the first permanent magnets is more than or equal to 0.5 and less than or equal to 2.

12. The generator as claimed in claim 1, wherein the permanent magnets of the group are fixed without any degree of freedom to one another and at least one of the group and the converter is movable, alternately, between:
- the first position in which the block of magnetostrictive material is opposite the group of permanent magnets, and
- the second position in which the block of magnetostrictive material is offset relative to the group of permanent magnets.

* * * * *